(12) United States Patent
Hyakudomi

(10) Patent No.: US 6,739,208 B2
(45) Date of Patent: May 25, 2004

(54) METHOD OF DELIVERING TARGET OBJECT TO BE PROCESSED, TABLE MECHANISM OF TARGET OBJECT AND PROBE APPARATUS

(75) Inventor: Takanori Hyakudomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 09/932,930

(22) Filed: Aug. 21, 2001

(65) Prior Publication Data

US 2002/0044864 A1 Apr. 18, 2002

(30) Foreign Application Priority Data

Aug. 22, 2000 (JP) ........................................ 2000-250542

(51) Int. Cl.$^7$ .............................................. H01L 21/68
(52) U.S. Cl. ...................................................... 73/865.8
(58) Field of Search ........................ 73/865.8; 324/754, 324/756, 757, 758, 759, 760, 761

(56) References Cited

U.S. PATENT DOCUMENTS

| 4,955,590 A | | 9/1990 | Narushima et al. | |
|---|---|---|---|---|
| 5,968,282 A | * | 10/1999 | Yamasaka | .................... 324/761 |
| 6,183,189 B1 | * | 2/2001 | Lzu et al. | |

\* cited by examiner

*Primary Examiner*—Robert Raevis
(74) *Attorney, Agent, or Firm*—Oblon, Spivak, McClelland, Maier & Neustadt, P.C.

(57) ABSTRACT

In the present invention, a main chuck comprises a table for performing the delivery of a wafer W to and from a pincette and a plurality of lift pins for allowing the wafer W to rise from the surface of the table. At least one lift pin positioned on the side of the pincette is made longer and positioned higher than the other lift pins so as to permit the wafer W to be supported above the table in an inclined manner.

10 Claims, 6 Drawing Sheets

US 6,739,208 B2

METHOD OF DELIVERING TARGET OBJECT TO BE PROCESSED, TABLE MECHANISM OF TARGET OBJECT AND PROBE APPARATUS

CROSS-REFERENCE TO RELATED APPLICATIONS

This application is based upon and claims the benefit of priority from the prior Japanese Patent Application No. 2000-250542, filed Aug. 22, 2000, the entire contents of which are incorporated herein by reference.

BACKGROUND OF THE INVENTION

1. Field of the Invention

The present invention relates to a method for delivering a target object to be processed onto a transfer device and to a table mechanism of the target object, particularly, to a delivering method of the target object, which permits smoothly delivering the target object from a table onto a transfer mechanism, and a table mechanism of the target object.

2. Description of the Related Art

The method of manufacturing a semiconductor device comprises various steps starting with the step of forming a film on a target object to be processed, e.g., a semiconductor wafer, and ending in the step of inspecting the semiconductor device produced. In each of these steps, the semiconductor wafer is delivered from the transfer mechanism of the semiconductor wafer onto the table mechanism of the semiconductor wafer. For example, in the inspecting step, a probe apparatus is used for inspecting the electrical characteristics of the IC chip formed on the surface of the semiconductor wafer.

The conventional probe apparatus comprises a transfer mechanism 13 (hereinafter referred to as "pincette") for transferring a wafer W and a table mechanism 15 (hereinafter referred to as "main chuck") for receiving the wafer W and disposing thereon the received wafer W, as shown in, for example, FIG. 1. The pincette 13 is arranged in a loader chamber 11, and the main chuck 15 is arranged in a prober chamber 12. A probe card 17 is arranged above the main chuck 15 within the prober chamber 11. The electrical characteristics of the integrated circuit formed on the wafer W disposed on the main chuck 15 are inspected by using the probe card 17 and a tester connected to the probe card 17.

As shown in FIG. 6A, the main chuck 15 comprises a table 15D on which the wafer W is disposed and a plurality of lift pins, e.g., three lift pins 20A–20C, vertically moved on the upper surface of the table 15D. When the wafer W is delivered between the pincette 1 and the table 15D, the lift pins 20A–20C project upward from the upper surface of the table 15D so as to receive the wafer W from the pincette 1 transferred from the loader chamber into the prober chamber. When the pincette 1 retreats into the loader chamber, the lift pins 20A–20C also retreat into the table 15D as shown in FIG. 5B so as to allow the wafer W to be disposed on the table 15D. Under this condition, a predetermined processing (inspection) is applied to the wafer W. After completion of the predetermined processing, the lift pins 20A–20C project upward from the table 15D so as to move the wafer W upward away from the table 15D. As shown in FIG. 6C, the pincette 1 proceeds onto the table 15D, and the lift pins 20A–20C retreat into the table 15D, with the result that the wafer W is delivered onto the pincette 1. Upon receipt of the wafer W, the pincette 1 transfers the wafer W into the loader chamber.

BRIEF SUMMARY OF THE INVENTION

In recent years, the diameter of the wafer W has been markedly increased, and the thickness of the wafer W has been markedly decreased. For example, the diameter of the wafer W has been increased from, for example, 200 mm to 300 mm, and the thickness of the wafer W has been decreased from about 500 $\mu$m to about 150 to 200 $\mu$m. It is possible for the wafer W to be bent as shown in FIG. 6B. FIG. 6C shows the state that the bent wafer W is delivered from the table 15A onto the pincette 1. Under this state, the pincette 1 is prevented from passing through the clearance between the periphery of the bent wafer W and the table 15A, with the result that the pincette 1 is incapable of being moved into the clearance between the wafer W and the table 15A. It follows that the pincette 1 fails to receive the wafer W, resulting in failure to perform a smooth delivery of the wafer W. The present invention is intended to overcome the above-noted problem.

An object of the present invention is to provide a technology for delivering a bent object to be processed from a table onto a transfer mechanism smoothly and without fail.

Another object of the present invention is to provide a probe apparatus for inspecting the electrical characteristics of the integrated circuit formed on a semiconductor wafer, in which a bent semiconductor wafer can be delivered from a table onto a transfer mechanism smoothly and without fail.

According to a first aspect of the present invention, there is provided a method of delivering a target object to be processed onto a transfer mechanism for allowing the transfer mechanism to take the target object from a table, comprising the steps of:

inclining the target object by making one end of the target object disposed on a table and having a predetermined processing applied thereto higher than the other end; and allowing the transfer mechanism to hold the inclined target object.

In the method of the present invention, it is desirable to allow a part of the target object to rise from the surface of the table so as to provide air between the target object and the table in the step of inclining the target object.

In the method of the present invention, it is desirable for the step of inclining the target object to comprise the sub-steps of:

making one end of the target object higher than the other end so as to allow the target object to have a predetermined inclination; and moving upward the target object to a predetermined height while maintaining the inclination.

In the method of the present invention, it is desirable for the step of inclining the target object to comprise the sub-steps of:

moving upward the target object to a predetermined height in parallel to the surface of the table; and making one end of the target object higher than the other end so as to incline the target object.

In the method of the present invention, it is desirable for the target object to be inclined such that the other end of the target object is brought out of contact with the table in the step of inclining the target object.

In the method of the present invention, it is desirable for the target object to be a semiconductor wafer, for the predetermined processing to be an inspection of the electrical characteristics of the integrated circuit formed on the semiconductor wafer, and for the transfer mechanism to be a pincette for transferring the semiconductor wafer.

In the method of the present invention, it is desirable for the step of inclining the target object of the semiconductor wafer to be performed by controlling the height to which each of a plurality of lift pins for supporting the semiconductor wafer, which are arranged in an upper portion of the table, is moved.

In the method of the present invention, it is desirable for the step of inclining the target object to comprise the sub-steps of:

moving upward at least one lift pin at a predetermined speed so as to cause a part of the target object to rise from the surface of the table, thereby introducing air into the clearance between the target object and the table; and moving upward each of the lift pins at a speed higher than the predetermined speed so as to move upward the target object.

According to a second aspect of the present invention, there is provided a table mechanism, comprising a table for performing the delivery of the target object to and from a transfer mechanism of the target object, and a plurality of lift pins for causing the target object on the table to rise from the table surface so as to support the target object, wherein at least one lift pin positioned on the side of the transfer mechanism is moved higher than the other lift pins such that the target object is supported by the lift pins in an inclined fashion.

According to a third aspect of the present invention, there is provided a table mechanism for receiving the target object transferred by a transfer mechanism, for applying a predetermined processing to the received target object, and for delivering the processed target object onto the transfer mechanism, comprising:

a table having the target object disposed thereon and provided with a plurality of lift pins in an upper portion thereof, the lift pins being moved upward from within the table onto the outside of the table when receiving the target object transferred by the transfer mechanism and when delivering the processed target object onto the transfer mechanism;

a driving mechanism for vertically moving the plural lift pins; and a control mechanism for controlling the driving mechanism, the control mechanism moving upward at least one of the lift pins to a position higher than the positions to which the other lift pins are moved upward, when the processed target object is delivered from the table onto the transfer mechanism, so as to incline the target object supported by the plural lift pins.

In the table mechanism according to the third aspect of the present invention, it is desirable for the control of the driving mechanism performed by the control mechanism of the table mechanism to be performed such that, when the processed target object is delivered onto the transfer mechanism, at least one of the lift pins is moved upward at a predetermined speed so as to cause a part of the target object to rise from the surface of the table, thereby introducing air into the clearance between the target object and the table, followed by moving upward the plural lift pins at a speed higher than the predetermined speed.

In the table mechanism according to the third aspect of the present invention, it is desirable for the control of the driving mechanism performed by the control mechanism of the table mechanism to be performed such that the target object is moved upward in parallel to the surface of the table to reach a predetermined height, and that one end of the target object is made higher than the other end so as to incline the target object.

In the table mechanism according to the third aspect of the present invention, it is desirable for the control of the driving mechanism performed by the control mechanism of the table mechanism to be performed such that one end of the target object on the side of the driving mechanism is made higher than the other end so as to impart a predetermined inclination to the target object, and that the target object is moved upward to a predetermined height while maintaining the inclined state.

In the table mechanism according to the third aspect of the present invention, it is desirable for the control of the driving mechanism performed by the control mechanism of the table mechanism to be performed such that the target object is inclined by making higher one end of the target object on the side of the driving mechanism, the degree of inclination being controlled such that the other end of the target object is brought out of contact with the table.

In the table mechanism according to the third aspect of the present invention, it is desirable for the target object to be a target object to be inspected, and for the predetermined processing to be the inspection of the electrical characteristics of the target object.

Further, in the table mechanism according to the third aspect of the present invention, it is desirable for the target object in the table mechanism to be a semiconductor wafer, for the predetermined processing to be an inspection of the electrical characteristics of the integrated circuit formed on a semiconductor wafer, and for the transfer mechanism to be a pincette for transferring the semiconductor wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 2A, 2B and 2C are side views for explaining the operation of the main chuck in an embodiment of the present invention, wherein FIG. 2A shows the state that a pincette is moved onto a position right above the table for delivering a semiconductor wafer, FIG. 2B shows the state that the wafer is delivered between the pincette and lift pins, and FIG. 2C shows the state that one end of the semiconductor wafer is made higher than the other end by the lift pins so as to incline the semiconductor wafer on the table;

FIGS. 3A, 3B and 3C are side views for explaining the operation of the main chuck in another embodiment of the present invention, wherein FIG. 3A shows the state that a pincette is moved to a position right above the table for delivering a semiconductor wafer, FIG. 3B shows the state that the wafer is delivered between the pincette and the lift pins, and FIG. 3C shows the state that one end of the semiconductor wafer is held higher than the other end by the lift pins so as to incline the semiconductor wafer above the table;

FIGS. 4A to 4G are side views for explaining the operation of the main chuck in another embodiment of the present invention, wherein FIG. 4A shows the state that a pincette is moved to a position right above the table, FIG. 4B shows the state that a semiconductor wafer is delivered from the pincette onto the lift pins, FIG. 4C shows the state that the pincette retreats from the table, FIG. 4D shows the state that, after a predetermined processing, one end of the semiconductor wafer is moved upward by the lift pins for introducing the air into the clearance between the semiconductor wafer and the table, FIG. 4E shows the state that one end of the semiconductor wafer is made higher than the other end by the lift pins, thereby inclining the semiconductor wafer above the table, FIG. 4F shows the state immediately before the semiconductor wafer is delivered from the lift pins onto the pincette, and FIG. 4G shows the state after the semiconductor wafer is delivered from the lift pins onto the pincette;

FIGS. 5A and 5B show the other process for forming the state shown in FIG. 4E, wherein FIG. 5A shows the former step, and FIG. 5B shows the latter step; and FIGS. 6A, 6B and 6C are side views for explaining the operation of the main chuck in a conventional probe apparatus, wherein FIG. 6A shows the state that a pincette is moved to a position right above the table for delivering the wafer, FIG. 6B shows the state that the wafer is disposed on the table, and FIG. 6C shows the state that the wafer is moved upward on the table by the lift pins.

DETAILED DESCRIPTION OF THE INVENTION

The present invention will now be described with reference to the embodiment shown in FIGS. 1, 2A to 2C, 3A to 3C, 4A to 4G and 5A to 5B. The present invention is directed to a method for delivering a target object to be processed onto a transfer mechanism and to a table mechanism of the target object. It should be noted that the target object handled in the present invention, the processing applied to the target object and the construction of the transfer mechanism are not particularly limited in the present invention. However, for specifically describing the present invention, the following description is directed to an embodiment in which the technical idea of the present invention is applied to a probe apparatus for inspecting the electrical characteristics of the integrated circuit formed on a semiconductor wafer.

Figure 1:
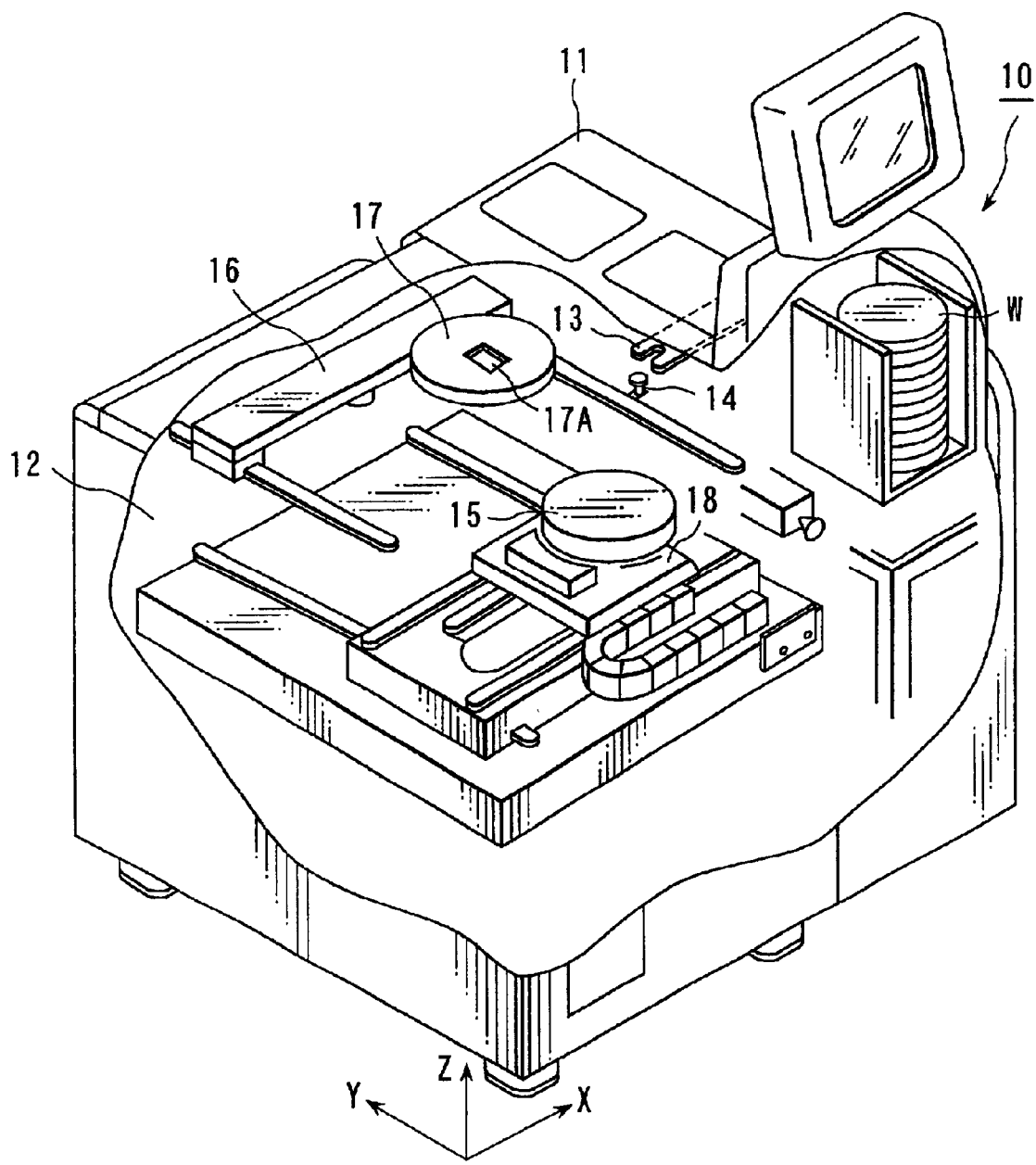
FIG. 1 is an oblique view showing the internal structure of a probe apparatus to which the present invention is applied.

FIG. 1 exemplifies a probe apparatus 10 to which the technical idea of the present invention can be applied. The probe apparatus 10 shown in FIG. 1 comprises a loader chamber 11 for transferring a wafer W and for preliminarily determining the position of the wafer W and a prober chamber 12 for inspecting the electrical characteristics of the wafer W transferred from the loader chamber 11. A transfer mechanism 13 (hereinafter referred to as "pincette") and a preliminary position determining mechanism 14 (hereinafter referred to as "sub-chuck") are arranged in the loader chamber 11. While the wafer W is being transferred by the pincette 13, a preliminary position of the wafer W is determined by the sub-chuck 14 on the basis of the orientation flat of the wafer W. A table mechanism 15 (hereinafter referred to as "main chuck") and a position determining mechanism 16 are arranged within the prober chamber 12. The wafer W transferred from the transfer mechanism is disposed on the main chuck 15. A probe card 17 is arranged above the main chuck 15. The main chuck 15 is moved in the X, Y, Z and θ-directions in co-operation with the position determining mechanism 16 so as to determine the position of the wafer W relative to a probe 17A of the probe card 17. The main chuck 15 is moved in the X, Y and Z-directions via an X, Y, Z-table 18 and is swung in the θ-direction. When the electrical characteristics of the wafer W are inspected, the inspecting electrodes (hereinafter referred to as "electrode pads") of the integrated circuit formed on the wafer W whose position has been determined are successively brought into contact with the probes 17A of the probe card 17 by indexing the main chuck 15. In this contact process, the electrical characteristics of the integrated circuit are inspected via a test head (not shown) connected to the probe.

Figure 2A:
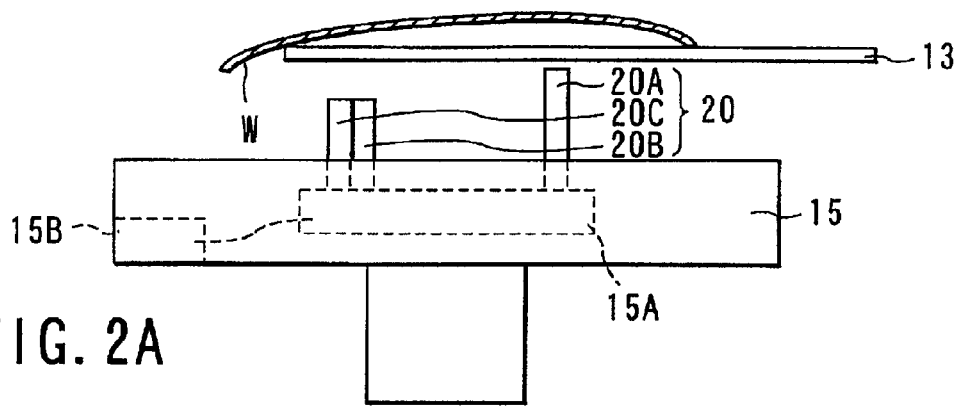
Figure 2B:
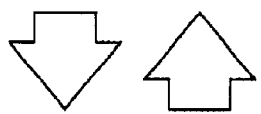
Figure 2B:
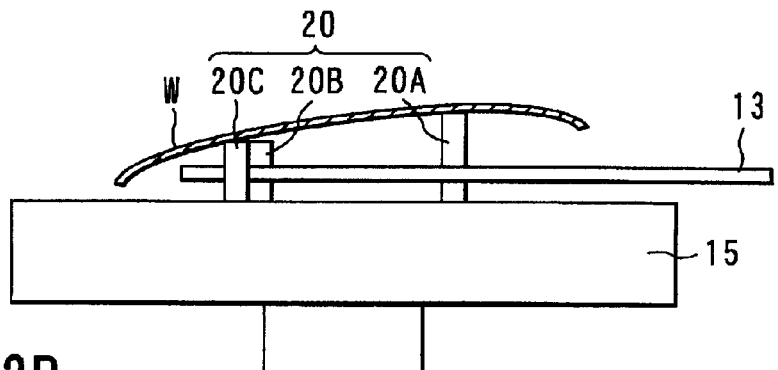
Figure 2C:
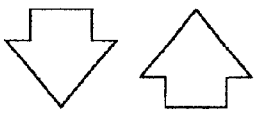
Figure 2C:
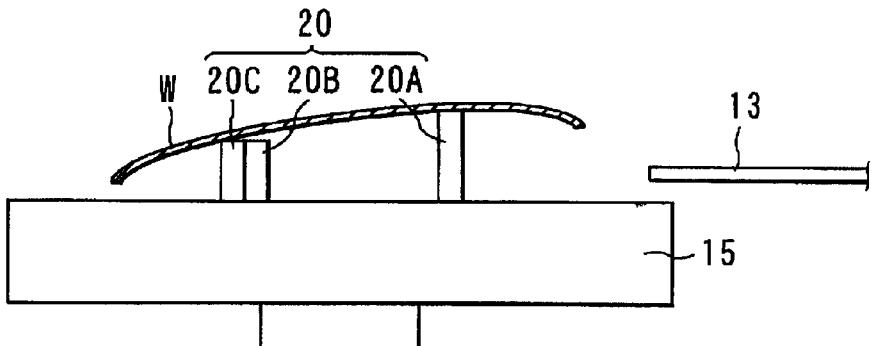

As shown in FIGS. 2A to 2C, the main chuck 15 in this embodiment comprises a table 15 having the wafer W disposed thereon, a plurality of lift pins 20 (three lift pins 20 in FIG. 2), and a lift pin driving mechanism 15A arranged within the table 15. It is possible to arrange the three lift pins 20 equidistantly on a circle in a central portion of the table 15. As shown in FIG. 2A, at least one of the three lift pins 20, i.e., a first lift pin 20A, is formed longer than the other two lift pins, i.e., a second lift pin 20B and a third lift pin 20C. The first lift pin 20A is arranged in a position close to the pincette 13. The height to which these lift pins project from the surface of the table 15 is 7 mm for the first lift pin 20A, and 4 mm for each of the second and third lift pins 20B, 20C. In this embodiment, the first lift pin 20A is set higher by 3 mm than each of the second and third lift pins 20B and 20C. Under the state that the first lift pin 20A projects upward from the surface of the table 15, the wafer W on the side of the pincette 13 is lifted 3 mm higher than the opposite side so as to allow the wafer W to be inclined as shown in FIG. 3C. It is desirable for the upper limit of the inclination of the wafer W to be set such that the wafer W on the side opposite to the side of the pincette 13 is brought out of contact with the surface of the table 15.

Figure 3A:
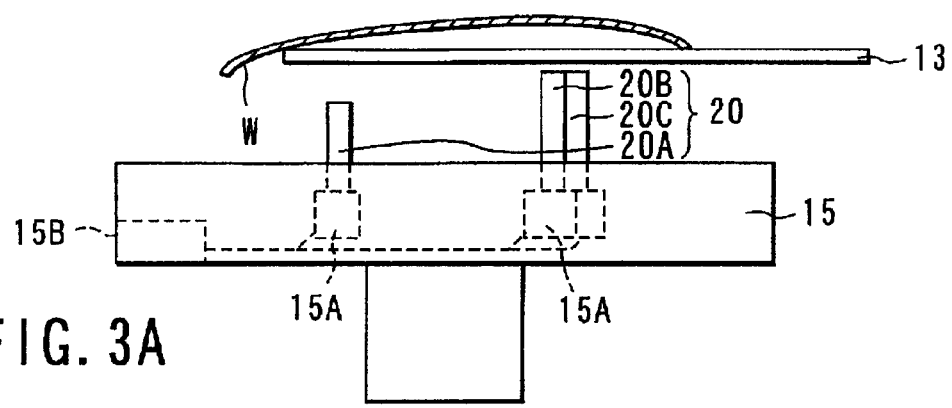
Figure 3B:
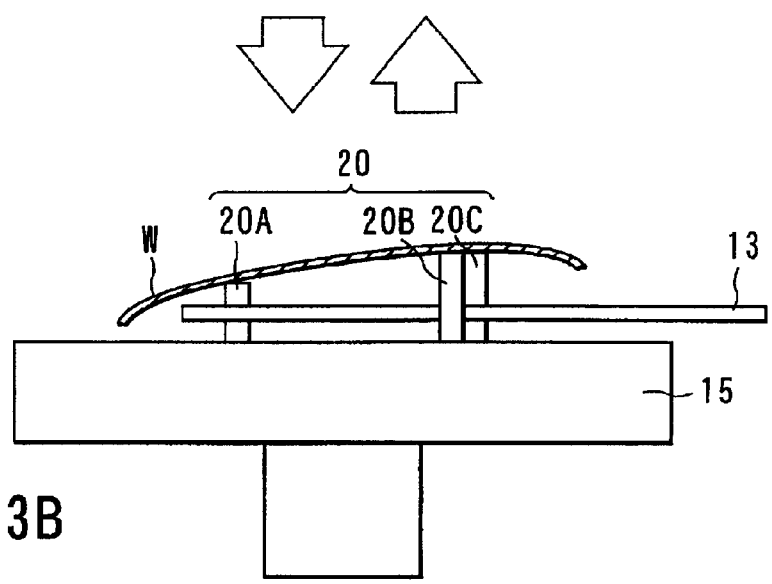
Figure 3C:
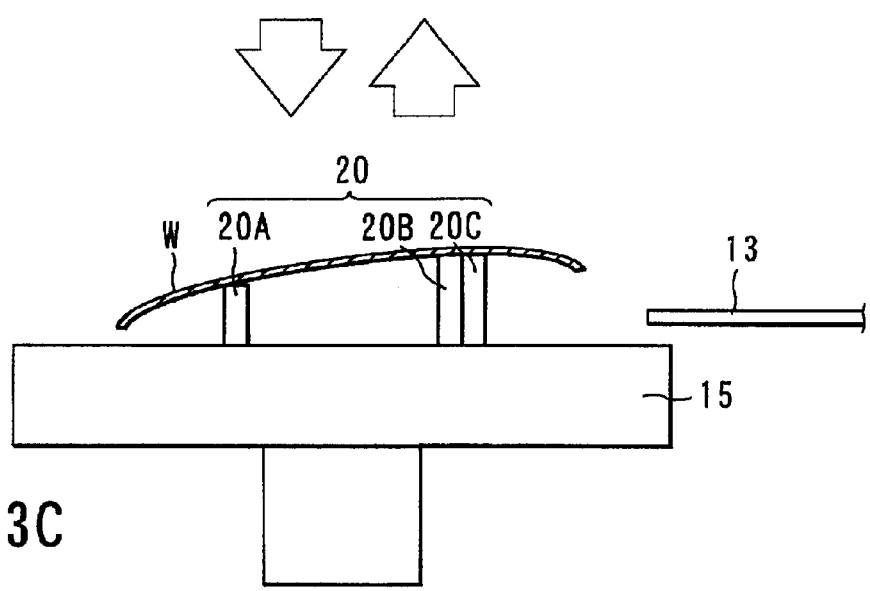

FIGS. 3A to 3C show another example of the main chuck 15 to which the technical idea of the present invention can be applied. As shown in FIG. 3A, the main chuck 15 in this embodiment comprises the table 15 having the wafer W disposed thereon, a plurality of lift pins 20 (three lift pins in FIG. 3A), and a lift pin driving mechanism 15A arranged within the table 15. Each lift pin 20 is provided with a lift pin driving mechanism 15A. It is possible to employ a driving mechanism utilizing an electric motor or a driving mechanism equipped with a cam as the lift pin driving mechanism 15A. The lift pin driving mechanism is controlled by a control device 15B. It is possible to arrange the three lift pins 20 equidistantly on a circle in a central portion of the table 15. As shown in FIG. 3A, at least two of the three lift pins 20, i.e., a first lift pin 20A and a second lift pin 20B, are formed longer than the other pin, i.e., a third lift pin 20C. The first lift pin 20A and the second lift pin 20B are arranged in positions close to the pincette 13. The projecting height of the lift pin from the surface of the table 18 is 7 mm for each of the first and second lift pins 20A and 20B and 6 mm for the third lift pin 20C. In this embodiment, each of the first lift pin 20A and the second lift pin 20B is set higher by 1 mm than the third lift pin 20C. Under the state that the lift pins 20 project upward from the table 15, the wafer W on the side of the pincette 13 is set higher by 1 mm than on the opposite side so as to allow the wafer W to be inclined. It is desirable for the upper limit of the inclination of the wafer W to be set such that the wafer W on the side opposite to the side of the pincette 13 is brought out of contact with the surface of the table 15B.

Figure 4A:
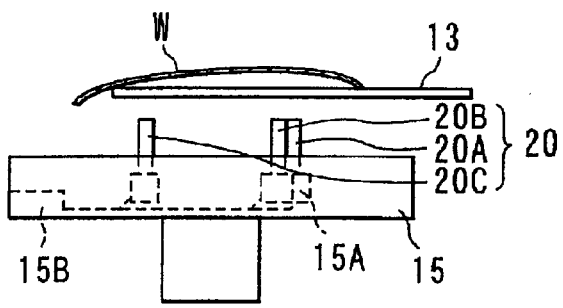
Figure 4G:
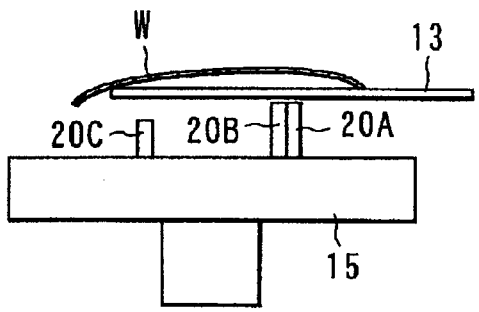
Figure 4B:
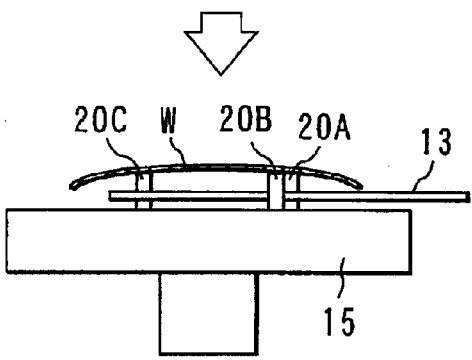
Figure 4F:
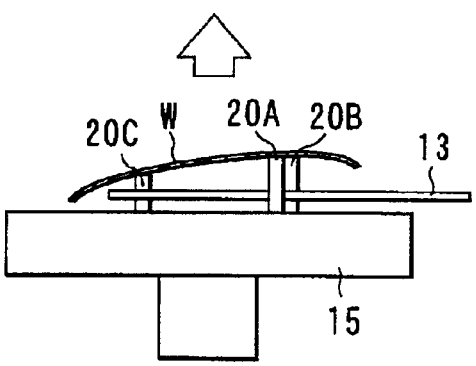
Figure 4C:
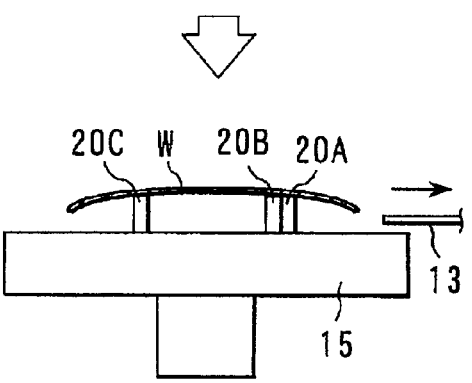

FIGS. 4A to 4C show another example of the main chuck 15 to which the technical idea of the present invention can be applied. As shown in FIG. 4A, the main chuck 15 in this embodiment comprises a table 15 having the wafer disposed thereon, a plurality of lift pins 20 (three lift pins in FIG. 4A), and a lift pin driving mechanism 15A arranged within the table 15. Each lift pin 20 is provided with a lift pin driving mechanism 15A. It is possible to employ a driving mechanism utilizing an electric motor or a driving mechanism equipped with a cam as the lift pin driving mechanism 15A. The lift pin driving mechanism is controlled by a control device 15B.

Figure 4E:
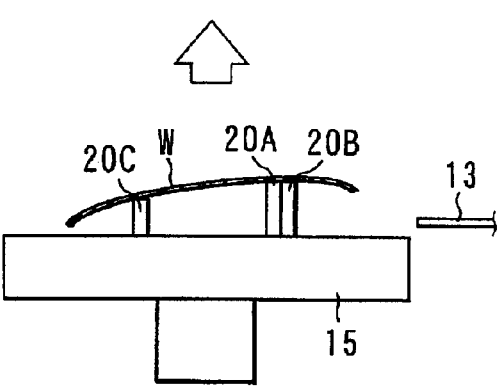
Figure 4D:
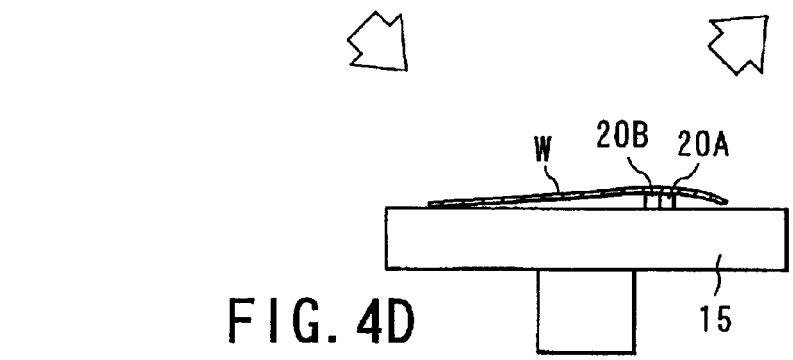

It is possible to arrange the three lift pins 20 equidistantly on a circle in a central portion of the table 15. It is possible to form at least two of the three lift pins 20, i.e., a first lift pin 20A and a second lift pin 20B, longer than the other pin, i.e., a third lift pin 20C. These three lift pins can be moved upward by the driving mechanism 15A to various heights from the surface of the table 15. FIG. 4A shows the state that the three lift pins are set at the same height from the surface of the table 15. FIG. 4D shows the state that only the first lift pin and the second lift pin are slightly moved upward from the surface of the table 15 so as to allow air to be introduced into the clearance between the semiconductor wafer W and the surface of the table 15. Further, FIG. 4E shows the state that the first and second lift pins are moved higher than the third lift pin.

The first lift pin 20A and the second lift pin 20B are arranged in positions close to the pincette 13. The projecting height of these lift pins from the surface of the table 15 is, for example, 7 mm for each of the first and second lift pins 20A and 20B and 6 mm for the third lift pin 20C. In this example, the first lift pin 20A and the second lift pin 20B are set higher by 1 mm than the third lift pin 20C. Under the state that the lift pins 20 project from the surface of the table 15, the wafer W on the side of the pincette 13 is set higher by 1 mm than the opposite side, as shown in FIG. 3C so as to allow the wafer W to be inclined. It is desirable for the upper limit of the inclination of the wafer W to be set such that the wafer W on the side opposite to the side of the pincette 13 is brought out of contact with the surface of the table 15B.

The operation of the apparatus of the present invention will now be described. First of all, how to perform the delivery of the wafer W between the loader chamber 11 and the prober chamber 12 will be described with reference to FIGS. 2A to 2C in respect of the probe apparatus 10 to which the technical idea of the present invention is applied. As shown in FIG. 2A, the pincette 13 supporting the wafer W is moved from the loader chamber 11 into the prober chamber 12. In accordance with the movement of the pincette 13, the three lift pins 20 are caused to project upward from the upper surface of the table 15. When the pincette 13 is moved to reach a position right above the table 15, the wafer W is in a position to be delivered onto the three lift pins 20.

In the next step, the pincette 13 is moved downward so as permit the wafer W to be disposed on the lift pins 20, as shown in FIG. 2B. Since the first lift pin 20A is positioned higher than the other two lift pins 20B and 20C, the wafer W is supported by the lift pins 20 in an inclined fashion.

Then, the pincette 13 is moved away from the table 15, as shown in FIG. 2C. While the pincette 13 is retreated from the prober chamber into the loader chamber, the lift pins 20 are moved downward into the table 15, with the result that the wafer W is disposed on the table 15 (not shown). Then, predetermined electrical characteristics of the wafer W on the table 15 are inspected while the wafer W is subjected to an index transfer.

After the inspection, the wafer W is delivered from the table 18 onto the pincette 13. The lift pins 20 are moved upward from within the table 15 so as to move upward the wafer W. Since the first lift pin 20A on the side of the pincette 13 is longer than the other two lift pins 20B and 20C, the wafer W is supported by the lift pins 20 in an inclined fashion. One end of the wafer on the side of the pincette 13 is moved upward so as to form a large clearance between the wafer W and the surface of the table 15. It follows that, even if the wafer W is bent as shown in FIG. 2C, the movement of the pincette 13 is not obstructed by the edge portion of the wafer W, with the result that the pincette 13 is capable of movement into the clearance between the table 15 and the wafer W. As shown in FIG. 2A, the pincette 13 is moved upward so as to receive the wafer W from the lift pins 20 and, then, retreats from the prober chamber into the loader chamber.

According to the embodiment described above, a plurality of lift pins 20 are caused to project upward from the upper surface of the table 15 when the electrical characteristics of the wafer W are inspected. Since the first lift pin 20A on the side of the pincette 13 is longer than any of the second and third lift pins 20B, 20C on the opposite side, the first lift pin 20A moves upward the wafer W from the table 15 to a position higher than the positions to which the wafer W is moved upward by the second and third lift pins 20B, 20C. A clearance through which the pincette 13 can be moved is formed between the table 15 and the edge of the wafer W, which is bent in the shape of a hat, on the side of the pincette 13. It is possible for the pincette 13 to be moved through the particular clearance toward the table so as to receive the wafer W without fail. It follows that, even if the wafer W is bent, the pincette 13 is capable of receiving the wafer W from the table 15 smoothly without fail.

How to perform the delivery of the wafer W between the loader chamber 11 and the prober chamber 12 will now be described with reference to FIGS. 3A to 3C in respect of the probe apparatus 10 to which the technical idea of the present invention is applied. As shown in FIG. 3A, the pincette 13 supporting the wafer W is moved from the loader chamber 11 into the prober chamber 12. In accordance with the movement of the pincette 13, the three lift pins 20 are caused to project upward from the upper surface of the table 15. In this embodiment, the two lift pins 20A and 20B are arranged on the side of the pincette 13, and the other lift pin 20C is arranged on the opposite side. When the pincette 13 is moved through the clearance between the two lift pins 20A and 20B so as to reach a region right above the table 15, the wafer W is in a position to be delivered onto the three lift pins.

If the pincette 13 is moved downward, the wafer W is disposed on the lift pins 20, as shown in FIG. 3B. Since the first lift pin 20A and the second lift pin 20B are positioned higher than the third lift pin 20C, the wafer W is supported in an inclined state by these lift pins 20.

Then, the pincette 13 is moved away from the table 15, as shown in FIG. 3C. While the pincette 13 is retreated from the prober chamber into the loader chamber, the lift pins 20 are retreated into the table 15, with the result that the wafer W is disposed on the table 15 (not shown). Then, predetermined electrical characteristics of the wafer W disposed on the table 15 are inspected while the wafer W is subjected to an index transfer.

After completion of the inspection, the delivery of the wafer W is performed from the table 15 onto the pincette 13. Specifically, the lift pins 20 are moved upward from within the table 15 so as to move upward the wafer W. Since the first and second lift pins 20A, 20B on the side of the pincette 13 are longer than the lift pin 20C on the opposite side, the wafer W is supported by the lift pins 20 in an inclined state. A large clearance is formed between the surface of the table 15 and the wafer W when the edge portion of the wafer W on the side of the pincette 13 is moved upward. It follows that, even if the wafer W is bent as shown in FIG. 3C, the movement of the pincette 13 is not obstructed by the edge portion of the wafer W so as to permit the pincette 13 to be moved through the clearance between the table 15 and the wafer W, as shown in FIG. 3B. Then, the pincette 13 is moved upward as shown in FIG. 3A so as to receive the wafer W from the lift pins 20 and, then, retreated from the prober chamber into the loader chamber.

According to this embodiment, a plurality of lift pins 20 are caused to project upward from the upper surface of the table 15 when the electrical characteristics of the wafer W are inspected. Since the first and second lift pins 20A, 20B on the side of the pincette 13 are longer than the third lift pin 20C on the opposite side, the first and second lift pins 20A, 20B serve to move upward the wafer W from the table 15 to positions higher than the position to which the wafer W is moved upward by the third lift pin 20C. A clearance through which the pincette 13 can be moved is formed between the table 15 and the edge portion of the wafer W, which is bent in the shape of a hat, on the side of the pincette 13. The pincette 13 proceeds toward the table through the clearance noted above so as to receive the wafer W without fail. It follows that, even if the wafer W is bent, it is possible for the pincette 13 to receive the wafer W from the table 15 smoothly and without fail.

Another example as to the delivery of the wafer W between the loader chamber 11 and the prober chamber 12 will now be described with reference to FIGS. 4A to 4G in respect of the probe apparatus 10 to which the technical idea of the present invention is applied. As shown in FIG. 4A, the pincette 13 supporting the wafer W is moved from the loader chamber 11 into the prober chamber 12. In accordance with the movement of the pincette 13, the three lift pins 20 are caused to project upward from the upper surface of the table 15. In this embodiment, the two lift pins 20A and 20B are arranged on the side of the pincette 13, and the other lift pin 20C is arranged on the opposite side. Each of these lift pins is individually moved up and down by the driving mechanism 15A. When the pincette 13 is moved through the clearance between the two lift pins 20A and 20B so as to reach a region right above the table 15, the wafer W is in a position to be delivered onto the three lift pins. Under this state, it is possible for the three lift pins 20 to be moved upward to the same height from the table.

If the pincette 13 is moved downward, the wafer W is disposed horizontal on the lift pins 20, as shown in FIG. 4B. Then, the pincette 13 retreats from the table 15, as shown in FIG. 4C. While the pincette 13 is retreated from the prober chamber into the loader chamber, the lift pins 20 are moved downward into the table 15, with the result that the wafer W is disposed on the table 15. Then, the air is sucked through a suction hole formed in the upper surface of the table so as to establish a vacuum state between the wafer W and the table 15. By this sucking treatment, the wafer W is tightly attached to the upper surface of the table 15 so as to permit the wafer W to be fixed to the table 15 (not shown). Then, predetermined electrical characteristics of the wafer W disposed on the table 15 are inspected while the wafer W is subjected to an index transfer.

After completion of the inspection, the wafer W is delivered from the table 15 onto the pincette 13. It should be noted that a vacuum state is established between the wafer W and the table 15 by the sucking treatment described above and, thus, the wafer W is tightly attached to the table 15. If the lift pins 20 are abruptly projected upward under this state, an unnatural force is applied to a part of the wafer W by the projected pins 20, with the result that the wafer W tends to be broken. In order to prevent the breakage of the wafer W, it is necessary to loosen first the tight contact between the wafer W and the table 15. For loosening the tight contact noted above, it is necessary to introduce air into the clearance between the wafer W and the table 15. For releasing the tight contact noted above, the lift pins are projected upward first at a speed low enough to prevent the wafer W from being broken, said speed being determined on the basis of the hardness of the wafer W, so as to move upward the wafer W such that the air can be introduced into the clearance between the wafer W and the table 15. By introducing air into the clearance noted above, the tight contact between the wafer W and the table 15 is released. After the tight contact between the wafer W and the table 15 has been released, the lift pins are projected upward at the ordinary speed so as to move upward the wafer W to a predetermined position. The tight contact between the wafer W and the table 15 can also be released by another method. Specifically, the lift pins 20 are projected upward first at a speed low enough to prevent the wafer W from being broken, said speed being determined on the basis of the hardness of the wafer W, followed by once stopping the lift pins 20 so as to permit the air introduction, thereby releasing the tight contact between the wafer W and the table 15. FIG. 4D shows the case where the lift pins 20A, 20B are slightly moved upward. It should be noted, however, that it suffices to move upward slightly at least one of the lift pins 20. By this step, the wafer W is rendered ready for the upward movement from the table 15.

As shown in FIG. 4E, the three lift pins 20 are moved upward. These lift pins 20 can be moved upward at a speed higher than the moving speed under the state shown in FIG. 4D. In this step, the first and second lift pins 20A, 20B on the side of the pincette 13 are moved to positions higher than the position to which the lift pin 20C on the opposite side is moved, with the result that the wafer W is supported by the lift pins 20 in an inclined state. Naturally, the edge of the wafer W on the side of the pincette 13 is moved upward as shown in FIG. 4E so as to form a large clearance between the wafer W and the surface of the table 15. It follows that, even if the wafer W is bent as shown in FIG. 4E, the movement of the pincette 13 is not obstructed by the edge portion of the wafer W as shown in FIG. 4F, making it possible for the pincette 13 to be moved into the clearance between the table 15 and the wafer W. Further, as shown in FIG. 4G, the pincette 13 is moved upward so as to receive the wafer W from the lift pins 20 and, then, retreated from the prober chamber into the loader chamber.

Figure 5B:
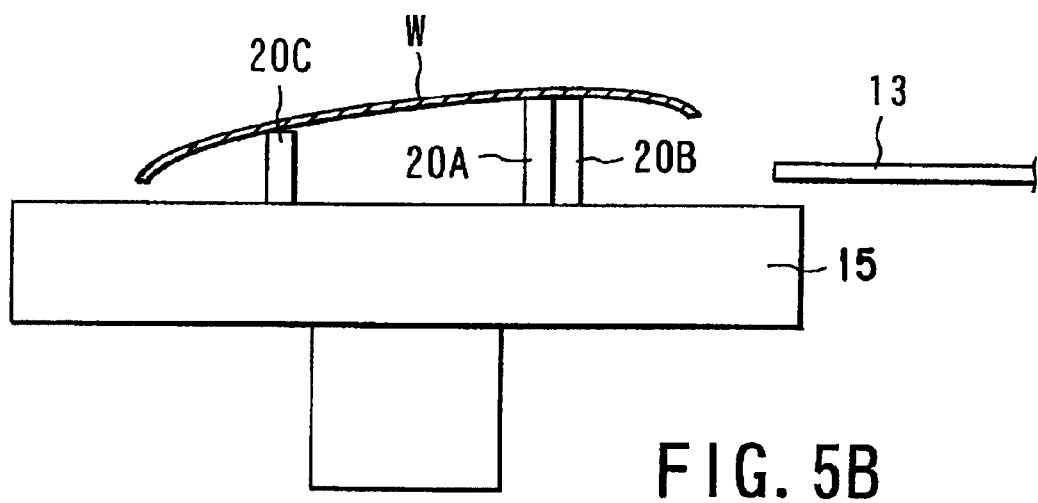
Figure 5A:
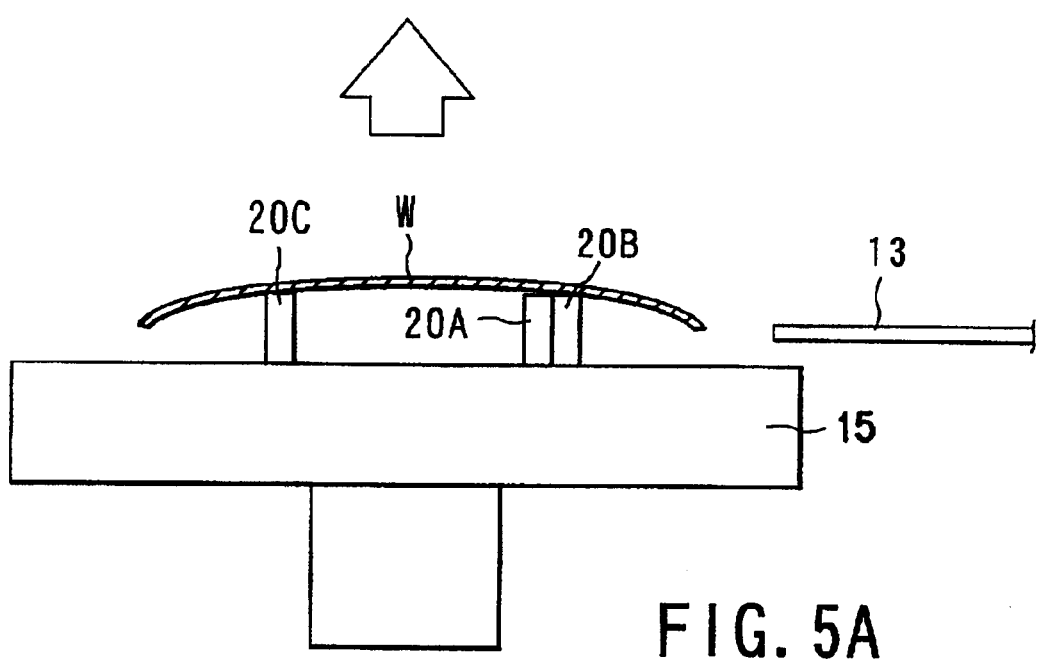
Figure 6A:
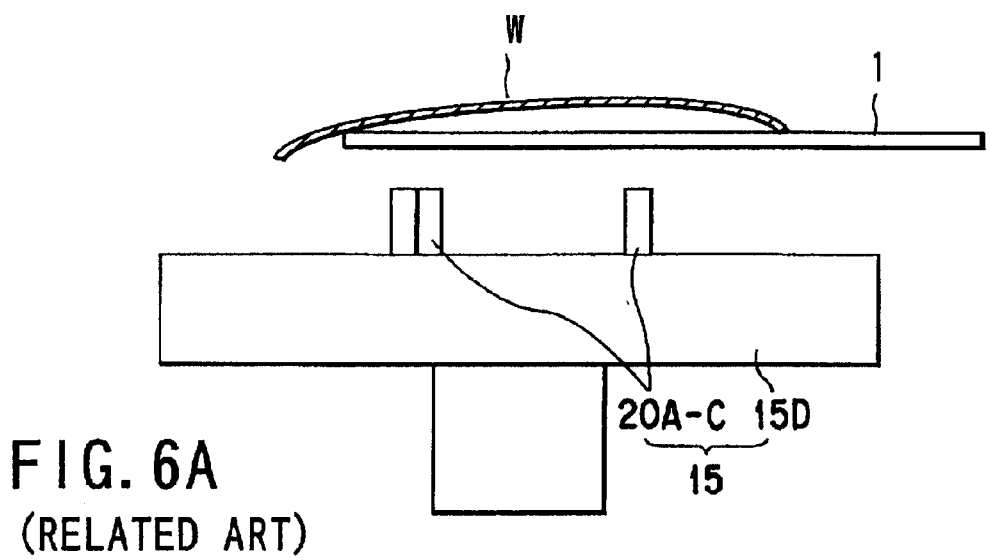
Figure 6B:
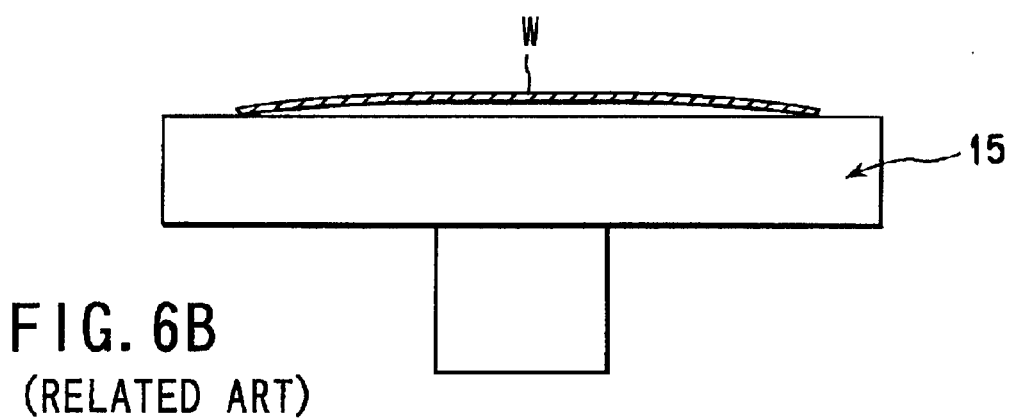
Figure 6C:
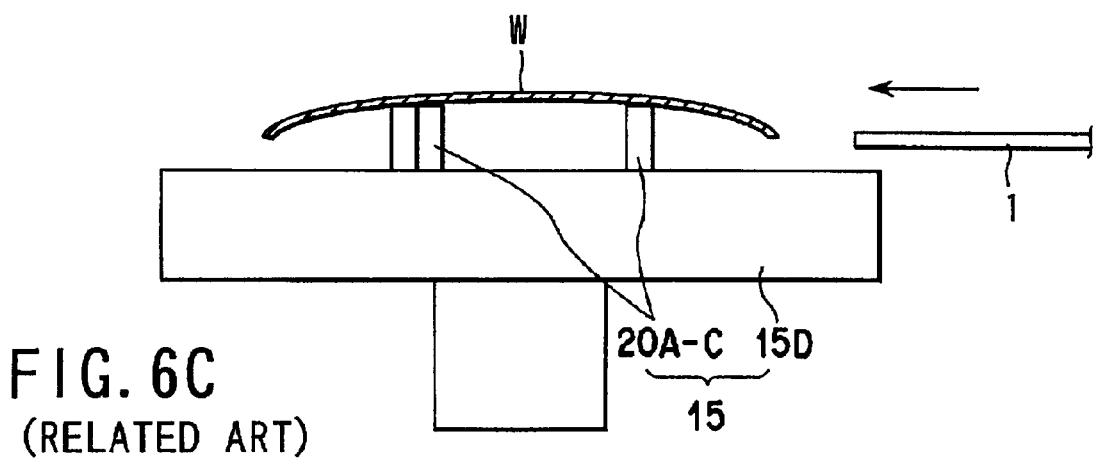

The upward movement of the three lift pins 20 under the state shown in FIG. 4E is controlled such that these three pins 20 can be moved upward to predetermined heights. Another mode of control is shown in FIGS. 5A and 5B. Specifically, the three lift pins 20 are moved upward first to the same height, as shown in FIG. 5A and, then, the first and second lift pins 20A and 20B are further moved upward as shown in FIG. 5B, with the result that the first and second lift pins 20A, 20B are positioned higher than the third lift pin 20C.

According to the embodiment shown in FIGS. 5A and 5B, the wafer W transferred by the pincette 13 is disposed on the three lift pins positioned on the same height, making it possible to dispose the wafer W accurately on the table 15, with the preliminary position of the wafer W determined in the loader chamber left unchanged.

After the electrical characteristics of the wafer W have been inspected, the wafer W can be smoothly moved upward from the table 15.

It is possible to form a clearance through which the pincette 13 can be moved between the edge of the wafer W, which is bent like a hat, on the side of the pincette 13 and the table 15. It is possible for the pincette 13 to be moved through the clearance toward the table 15 so as to receive the wafer W without fail. It follows that, even if the wafer is bent, the pincette 13 is capable of receiving the wafer W from the table 15 smoothly and without fail.

The present invention is not limited to each of the embodiments described above. The design of each member of the apparatus can be changed appropriately, as required. For example, a semiconductor wafer is used as the target object to be processed in each of the embodiments described above. However, a substrate for a liquid crystal display device or the like can also be used in the present invention as the target object. Also, the technical idea of the present invention is applied to a probe apparatus in each of the embodiments described above. However, the technical idea of the present invention can also be applied to processing apparatuses other than the probe apparatus. The technology, in which at least one lift pin positioned on the side of the transfer mechanism such as a pincette is made longer or positioned higher than the other lift pins so as to incline the target object arranged above the table, is included in the technical scope of the present invention.

As described above, the present invention provides a method of delivering a target object to be processed, which permits delivering the target object from the table onto the transfer mechanism smoothly and without fail, and a table mechanism of the target object.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of delivering a target object onto a transfer mechanism for allowing said transfer mechanism to take the target object from a plurality of lift pins, comprising the steps of:

inclining the target object by making one end of the target object disposed on a table higher than the other end wherein the target object is inclined such that a transfer-mechanism-approaching side of the target object is higher than an opposite side, and a lower end of the target object is prevented from coming into contact with a surface of the table;

moving the transfer mechanism into a space between the table and the target object, and allowing the transfer mechanism to pick up the target object from below; and allowing the transfer mechanism to hold said target object.

2. The delivering method according to claim 1, wherein a part of the target object is allowed to rise from the surface of the table so as to provide air between the target object and the table in the step of inclining the target object.

3. The delivering method according to claim 1, wherein the step of inclining the target object comprises the sub-steps of:

making one end of the target object higher than the other end so as to allow the target object to have a predetermined inclination; and moving upward the target object to a predetermined height while maintaining the inclination.

4. The delivering method according to claim 1, wherein the step of inclining the target object comprises the sub-steps of:

moving upward the target object to a predetermined height in parallel to the surface of the table; and making one end of the target object higher than the other end so as to incline the target object.

5. The delivering method according to claim 1, wherein the target object is inclined such that the other end of the target object is brought out of contact with the table in the step of inclining the target object.

6. The delivering method according to claim 1, wherein the target object is a semiconductor wafer, said predetermined processing is an inspection of the electrical characteristics of the integrated circuit formed on the semiconductor wafer, and said transfer mechanism is a pincette for transferring the semiconductor wafer.

7. The delivering method according to claim 6, wherein the step of inclining the target object of the semiconductor wafer is performed by controlling the height to which each of a plurality of lift pins for supporting the semiconductor wafer, which are arranged in an upper portion of the table, is moved.

8. The delivering method according to claim 7, wherein the step of inclining the target object comprises the sub-steps of:

moving upward at least one lift pin at a predetermined speed so as to cause a part of the target object to rise from the surface of the table, thereby introducing air into the clearance between the target object and the table; and moving upward each of the lift pins at a speed higher than said predetermined speed so as to move upward the target object.

9. A table mechanism for receiving the target object transferred by a transfer mechanism, for applying a predetermined processing to the received target object, and for delivering the processed target object onto the transfer mechanism, comprising:

a table having the target object disposed thereon and provided with a plurality of lift pins in an upper portion thereof, said lift pins being moved upward from within the table onto the outside of the table when receiving the target object transferred by said transfer mechanism and when delivering the processed target object onto said transfer mechanism;

a driving mechanism for vertically moving said plural lift pins; and a control mechanism for controlling said driving mechanism, said control mechanism moving upward at least one of said lift pins to a position higher than the positions to which the other lift pins are moved upward, when the processed target object is delivered from the table onto the transfer mechanism, so as to incline the target object supported by said plural lift pins, wherein the control of the driving mechanism performed by the control mechanism of the table mechanism is performed such that the target object is moved upward in parallel to the surface of the table to reach a predetermined height, and that one end of the target object is made higher than the other end so as to incline the target object.

10. A method of delivering a target object onto a transfer mechanism for allowing said transfer mechanism to take the target object from a plurality of lift pins, comprising the steps of:

inclining the target object by making one end of the target object disposed at a table higher than the other end, the other end being supported by one of the table and at least one of the lift pins, wherein the target object is inclined such that a transfer mechanism approaching side of the target object is higher than an opposite side and a lower end of the target object is prevented from coming into contact with a surface of the table, moving the transfer mechanism into a space between the table and the target object, and allowing the transfer mechanism to pick up the target object from below; and allowing the transfer mechanism to hold said inclined target object.

* * * * *